(12) United States Patent
Zhang

(10) Patent No.: US 9,831,189 B2
(45) Date of Patent: Nov. 28, 2017

(54) INTEGRATED CIRCUIT PACKAGE WITH A CONDUCTIVE GRID FORMED IN A PACKAGING SUBSTRATE

(71) Applicant: NVIDIA CORPORATION, Santa Clara, CA (US)

(72) Inventor: Leilei Zhang, Sunnyvale, CA (US)

(73) Assignee: NVIDIA Corporation, Santa Clara, CA (US)

( * ) Notice: Subject to any disclaimer, the term of this patent is extended or adjusted under 35 U.S.C. 154(b) by 526 days.

(21) Appl. No.: 13/938,134

(22) Filed: Jul. 9, 2013

(65) Prior Publication Data

US 2015/0016043 A1    Jan. 15, 2015

(51) Int. Cl.
*H01L 23/00*  (2006.01)
*H01L 23/498* (2006.01)
*H01L 23/50*  (2006.01)
*H01L 23/538* (2006.01)

(52) U.S. Cl.
CPC ...... *H01L 23/562* (2013.01); *H01L 23/49822* (2013.01); *H01L 23/49827* (2013.01); *H01L 24/81* (2013.01); *H01L 23/50* (2013.01); *H01L 23/5383* (2013.01); *H01L 23/5384* (2013.01); *H01L 2224/16225* (2013.01); *H01L 2924/15174* (2013.01); *H01L 2924/15311* (2013.01)

(58) Field of Classification Search
CPC ....................................... H01L 23/52

USPC ........................ 361/679.01–679.03
See application file for complete search history.

(56) References Cited

U.S. PATENT DOCUMENTS

| 7,605,460 B1* | 10/2009 | Wu | H01L 23/49822 |
| | | | 257/691 |
| 2013/0186676 A1* | 7/2013 | Yu | H01L 24/96 |
| | | | 174/257 |
| 2014/0174808 A1* | 6/2014 | Zhang | H05K 1/113 |
| | | | 174/261 |

* cited by examiner

*Primary Examiner* — Jerry Wu
(74) *Attorney, Agent, or Firm* — Artegis Law Group, LLP

(57) ABSTRACT

An integrated circuit package includes a packaging substrate, which has an electrically conductive grid formed on a dielectric layer, and an integrated circuit die electrically coupled to the electrically conductive grid at one or more locations. In this embodiment, the electrically conductive grid includes a plurality of electrically conductive portions, wherein each portion is electrically coupled to at least one other portion, and a plurality of void regions that are electrically non-contiguous and substantially free of electrically conductive material. One advantage of the integrated circuit package is that a packaging substrate that is reduced in thickness, and therefore rigidity, can still maintain planarity during operation. The electrically conductive grid formed on a dielectric layer in the packaging substrate can replace a power plane or a ground plane in the packaging substrate, thereby reducing stressed produced as a result of thermal expansion mismatch between materials in the packaging substrate.

12 Claims, 7 Drawing Sheets

INTEGRATED CIRCUIT PACKAGE WITH A CONDUCTIVE GRID FORMED IN A PACKAGING SUBSTRATE

BACKGROUND OF THE INVENTION

Field of the Invention

Embodiments of the present invention relate generally to integrated circuit chip packaging and, more specifically, to an integrated circuit package with a conductive grid formed in a packaging substrate.

Description of the Related Art

In the packaging of integrated circuit (IC) chips, it is generally desirable to minimize the size and thickness of chip packages. In mobile computing devices, such as smart phones, laptop computers, electronic tablets, and the like, it is particularly desirable to minimize the thickness of IC packages, so that such mobile devices can be further reduced in size and weight. One component in an IC package that directly affects IC package thickness is the packaging substrate.

The packaging substrate is a component of the chip package designed to route power, signal, and ground interconnects between an IC chip in the chip package to external electrical connections, such as a ball-grid array, for connecting the packaged IC chip to a printed circuit board. To this end, a packaging substrate typically includes electrically conductive traces formed in one or more layers on a surface of the packaging substrate. These electrically conductive traces are typically metallic, and therefore have a significantly greater coefficient of thermal expansion (CTE) than that of surrounding materials of the packaging substrate, such as the substrate core and build-up layers. Due to of this mismatch in CTE, when an IC package reaches operational temperature, warpage of the IC package can occur unless the packaging substrate is sufficiently rigid. Consequently, because packaging substrate rigidity is a function of packaging substrate thickness, reducing thickness of an IC package by reducing packaging substrate thickness can result in unacceptable warpage of the IC package during operation.

Accordingly, there is a need in the art for a thinner packaging substrate that does not undergo undo warpage during use.

SUMMARY OF THE INVENTION

One embodiment of the present invention sets forth an integrated circuit package that includes a packaging substrate, which has an electrically conductive grid formed on a dielectric layer, and an integrated circuit die electrically coupled to the electrically conductive grid at one or more locations. In this embodiment, the electrically conductive grid includes a plurality of electrically conductive portions, wherein each portion is electrically coupled to at least one other portion, and a plurality of void regions that are electrically non-contiguous and substantially free of electrically conductive material.

One advantage of the above-described embodiment is that a packaging substrate that is reduced in thickness, and therefore rigidity, can still maintain planarity during operation. This is because the electrically conductive grid formed on a dielectric layer in the packaging substrate can replace a power plane or a ground plane in the packaging substrate, thereby reducing stressed produced as a result of thermal expansion mismatch between materials in the packaging substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

One embodiment of the present invention sets forth an integrated circuit (IC) package that includes a packaging substrate that includes an electrically conductive grid formed on a dielectric layer of the packaging substrate. The electrically conductive grid can be configured as an electrical reference plane, or "ground plane," a power plane, or any other planar, electrically conductive structure in the packaging substrate. When one or more planar metallic structures in the packaging substrate, such as ground planes or power planes, are formed using such an electrical conductive grid, the packaging substrate can be reduced in thickness and still retain a desired planarity during operation.

Figure 1:
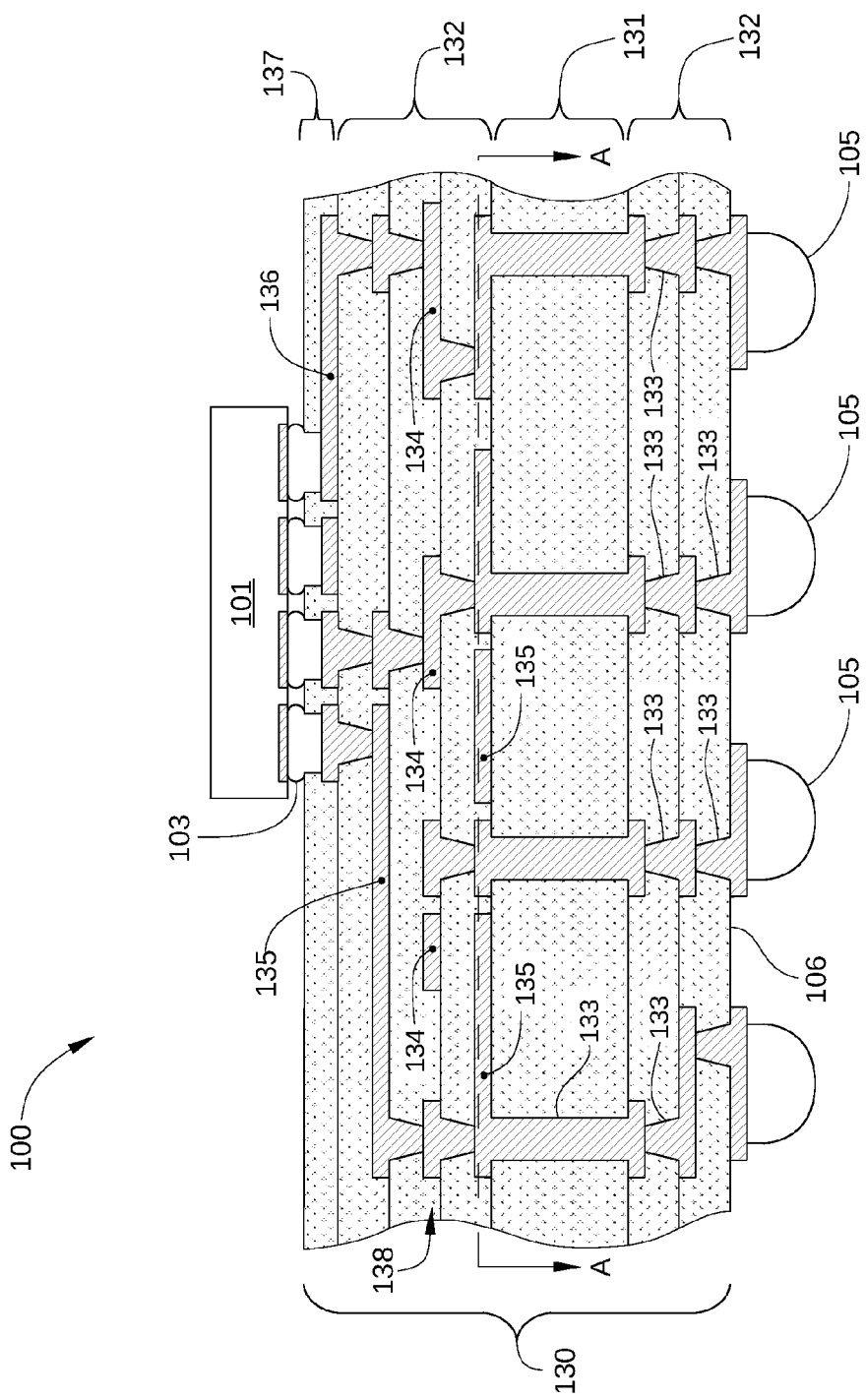
FIG. 1 is a schematic cross-sectional view of an integrated circuit package, according to one embodiment of the present invention.

FIG. 1 is a schematic cross-sectional view of an integrated circuit (IC) package 100, according to one embodiment of the present invention. IC package 100 may include one or more IC chips 101, each coupled to a packaging substrate 130. IC package 100 is configured to electrically and mechanically connect IC chip 101 and any other logic or memory ICs coupled to packaging substrate 130 to a printed circuit board or other mounting substrate (not shown) external to IC package 100. In addition, IC package 100 protects IC chip 101 from ambient moisture, contamination, and mechanical shock and stress. IC package 100 may also include a protective over-molding formed over IC chip 101 and/or a heat spreader mounted in contact with IC chip 101. For clarity, over-molding and a heat spreader in IC package 100 are not shown in FIG. 1.

In some embodiments, IC package 100 may be configured with one or more IC packages coupled thereto, either in addition to or in lieu of IC chip 101, and therefore may be fabricated using the so-called "package-on-package," or PoP method. In the PoP method, two or more IC packages are stacked or otherwise installed atop each other, typically using a standard interface for routing signals therebetween.

This configuration allows higher component density in computing devices, such as mobile phones, personal digital assistants (PDA), electronic tablets, digital cameras, and the like.

IC chip 101 may be a semiconductor die singulated from a separately processed semiconductor substrate, such as a CPU, a graphics processing unit (GPU), an application processor or other logic device, a memory chip, a global positioning system (GPS) chip, a radio frequency (RF) transceiver chip, a Wi-Fi chip, a system-on-chip, or any other semiconductor chip that is suitable for mounting on packaging substrate 130. Thus, IC chip 101 may be any IC chip that may benefit from being assembled together in a microelectronic package. Moreover, in FIG. 1, IC package 100 is shown with a single IC chip, but in other embodiments IC package 100 may be configured with multiple chips. In some embodiments, IC package 100 may be configured as a system-on-chip and may include a heterogeneous assortment of IC chips.

IC chip 101 may be coupled to packaging substrate 130 using solder microbumps 103 or any other technically feasible approach, and in some embodiments an underfill material is used to protect the electrical connections coupling IC chip 101 to packaging substrate 130. For clarity, no underfill material is illustrated in FIG. 1. A plurality of solder balls 105 or other chip package electrical connections may be arrayed on a PCB mounting surface 106 of packaging substrate 130 to facilitate electrical coupling of IC package 100 to a printed circuit board or other mounting substrate external to IC package 100. In the embodiment illustrated in FIG. 1, IC chip 101 is depicted as an unpackaged, or "bare," IC chip, but in other embodiments, IC chip may be a packaged IC chip.

Packaging substrate 130 provides IC package 100 with structural rigidity as well as an electrical interface for routing input and output signals and power between IC chip 101, any other IC chips coupled to packaging substrate 130, and an underlying support structure external to IC package 100, via electrical connections 105. For example, the underlying support structure may be a printed circuit board. Packaging substrate 130 generally includes a core board 131 and multiple build-up layers 132 laminated on each side of core board 131. Core board 131 and build-up layers 132 are typically formed from a dielectric material that is structurally rigid and electrically isolates electrically conductive elements of packaging substrate 130 from each other. Electrically conductive elements in packaging substrate 130 include via structures 133, which are disposed in core board 131 and build-up layers 132, interconnect lines 134, one or more ground planes 135, and one or more power planes 136. Together, via structures 133, interconnect lines 134, ground planes 135, and power plane 136 are configured to route power, ground, and/or input/output signals between IC chip 101, other IC chips coupled to packaging substrate 130, and a printed circuit board or other mounting substrate external to IC package 100. Packaging substrate 130 may also include a dielectric layer 137 that is formed as an insulative layer on one or more surfaces of packaging substrate 130. It is noted that for clarity, the thickness of the various elements of packaging substrate 130, e.g., core board 131, build-up layers 132, via structures 133, interconnect lines 134, ground planes 135, and power plane 136, are exaggerated with respect to the width of via structures 133, which may be on the order of 100 microns or more.

Via structures 133 may be plated through-hole vias, which are well-known in the art, or any other technically feasible via structure. The dimensions and materials of via structures 133 may be selected based on the configuration of IC chip 101, core board 131, build-up layers 132, and electrical connections 105. As shown in FIG. 1, via structures 133 provide routing of ground, power, and/or input/output signals between the various layers of packaging substrate 130. Interconnect lines 134 are electrically conductive traces configured to route input/output signals to and from IC chip 101, and are generally disposed in a redistribution layer (RDL) 138, formed on one of build-up layers 132. In some embodiments, interconnect lines 134 are traces etched from a metallic foil, such as a copper (Cu) or aluminum (Al), that is bonded to one or more build-up layers 132. In other embodiments, interconnect lines 134 may be formed by an electro-plating or other metal deposition process. For example, in some embodiments, interconnect lines 134 are formed by a copper plating process.

Ground planes 135 are electrically conductive structures that may be formed using materials and processes similar to those used to form interconnect lines 134. Unlike interconnect lines 134, ground planes 135 may be planar structures rather than wire-like traces, and are configured to provide ground potential to selected connection points on IC chip 101. Due to the high data input/output speeds associated with modern ICs, in some embodiments, interconnect lines 134 are disposed between ground planes 135 to improve the signal-to-noise ratio of signals carried by interconnect lines 134. In such embodiments, ground planes 135 may extend over most or substantially all of a build-up layer 132, and may include openings to accommodate via structures 133 used to route power or input/output signals in packaging substrate 130.

Power plane 136 is an electrically conductive structure that may be formed using materials and processes similar to those used to form interconnect lines 134 and ground planes 135. Power plane 136 may also be a planar structure formed on one of build-up layers 132, and is configured to provide power to selected connection points on IC chip 101.

According to embodiments of the present invention, one or more substantially planar electrically conductive structures in packaging substrate 130 are each configured as an electrically conductive grid rather than as a substantially unbroken plane of electrically conductive material. For example, in some embodiments, one or more of ground planes 135 and power plane 136 may each be configured as an electrically conductive grid. One such embodiment is illustrated in FIG. 2.

Figure 2:
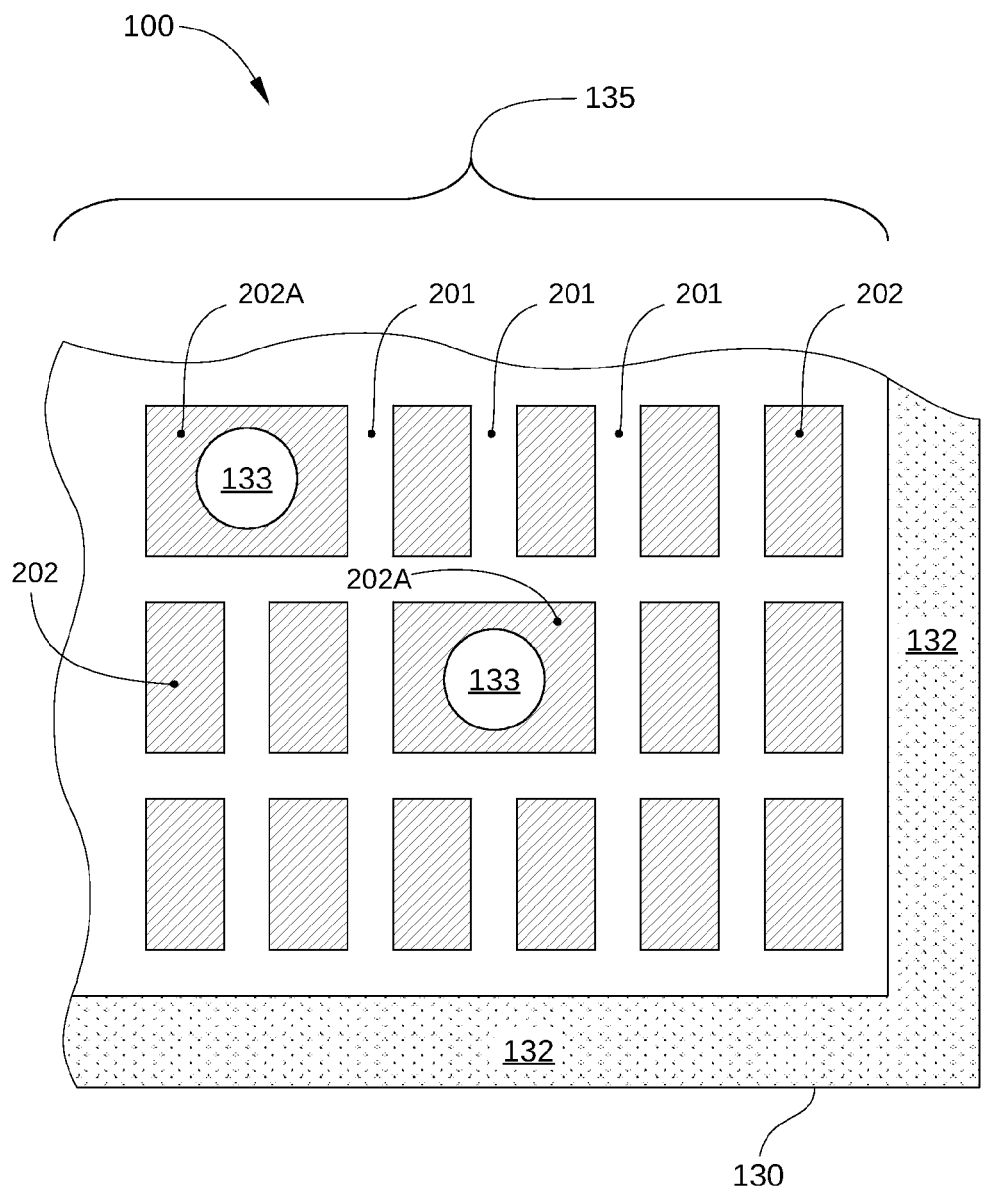
FIG. 2 is a partial plan view of the integrated circuit package of FIG. 1.

FIG. 2 is a partial plan view of IC package 100 of FIG. 1. The partial plan view is taken at section A-A in FIG. 1. As shown, ground plane 135 is configured as an electrically conductive grid of electrically conductive material rather than as a substantially unbroken plane of such material. Consequently, ground plane 135 includes a plurality of electrically conductive portions 201 and a plurality of void regions 202. Each of electrically conductive portions 201 is electrically coupled to at least one other electrically conductive portion 201, and therefore is configured to be at substantially the same electrical potential as other electrically conductive portions 201 of ground plane 135. Each of the plurality of void regions 202 are electrically non-contiguous and substantially free of electrically conductive material. In some embodiments, void regions 202 are formed by the selective removal of material from a layer of electrically conductive material deposited previously on one of build-up layers 132. In other embodiments, ground plane 135 may be selectively deposited as an electrically conductive grid, for example via a selective electroplating process.

In some embodiments, void regions 202 are substantially similar in size and shape, as depicted in FIG. 2. In other embodiments, different void regions 202 may include various sizes and shapes. Furthermore, void regions 202 may have any technically feasible shape, and are not limited to having a rectangular shape as shown in FIG. 2. For example, some or all of void regions 202 may be square, circular, triangular, etc. in shape. In addition, in some embodiments, some of void regions 202 are configured to accommodate via structures 133 that pass through ground plane 135 and the build-up layer 132 on which ground plane 135 is formed. In FIG. 2, these void regions 202 are denoted 202A. Void regions 202A allow ground plane 135 to be formed on extensive portions of or substantially all of build-up layer 132 without affecting the routing of power and/or input/output signals to IC chip 101.

During the operation and resultant heating of IC chip 101, stresses are produced in IC package 100 as a result of coefficient of thermal expansion (CTE) mismatch between electrically conductive components of packaging substrate 130 (e.g., interconnect lines 134, ground planes 135, and power planes 136) and dielectric components of packaging substrate 130 (e.g., core board 131 and build-up layers 132). Because ground plane 135 has a grid-like configuration that includes a plurality of void regions 202, ground plane 135 includes significantly less material than a ground plane that is configured as a substantially unbroken plane of electrically conductive material. For example, in some embodiments, ground plane 135 has a surface area that is less than half an initial surface area of the layer of electrically conductive material when the layer of electrically conductive material is first deposited. Consequently, stresses produced during operation as a result of such CTE mismatch can be significantly reduced. Such stresses may be reduced further due to the increased flexibility of such a grid configuration compared to a solid metallic plane of material. With less thermally induced stress in IC package 100, packaging substrate 130 can have less rigidity without undergoing undue warpage, thereby allowing core board 131 and build-up layers 132 to be configured as thinner laminated layers.

In some embodiments, the amount of electrically conductive material in packaging substrate 130 is further reduced by reducing a thickness of electrically conductive structures in the packaging substrate. For example, one or more of interconnect lines 134, ground planes 135, and power plane 136 may be formed with a thickness of 10 microns or less. In contrast, such electrically conductive structures are commonly formed with a thickness of 15 to 20 microns in packaging substrates.

In the embodiment illustrated in FIG. 2, ground plane 135 is configured as an electrically conductive grid. In other embodiments, power plane 136 is configured as an electrically conductive grid, and in yet other embodiments, both ground planes 135 and power plane 136 are configured as electrically conductive grids. Furthermore, in some embodiments, most or all of a particular planar, electrically conductive structure in packaging substrate 130 (e.g., one or both of ground planes 135 and/or power plane 136) is configured as an electrically conductive grid. In other embodiments a portion of a particular planar, electrically conductive structure is configured as an electrically conductive grid and a remaining portion of the planar structure is configured as a substantially unbroken plane of electrically conductive material. For example, in such embodiments, regions calculated to undergo the highest stress due to CTE mismatch between components of packaging substrate 130 may be configured as an electrically conductive grid and other portions may be configured as a substantially unbroken plane.

Figure 3:
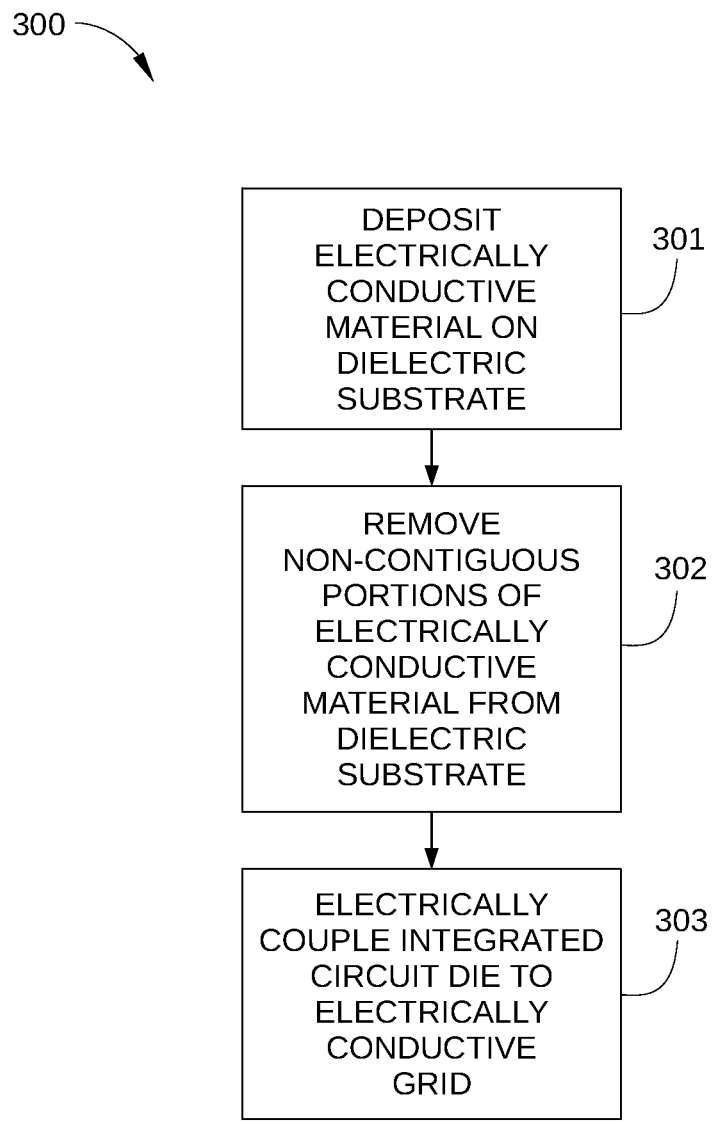
FIG. 3 sets forth a flowchart of method steps for forming an electrically conductive grid within an integrated circuit chip, according to one embodiment of the present invention.
Figure 4A:
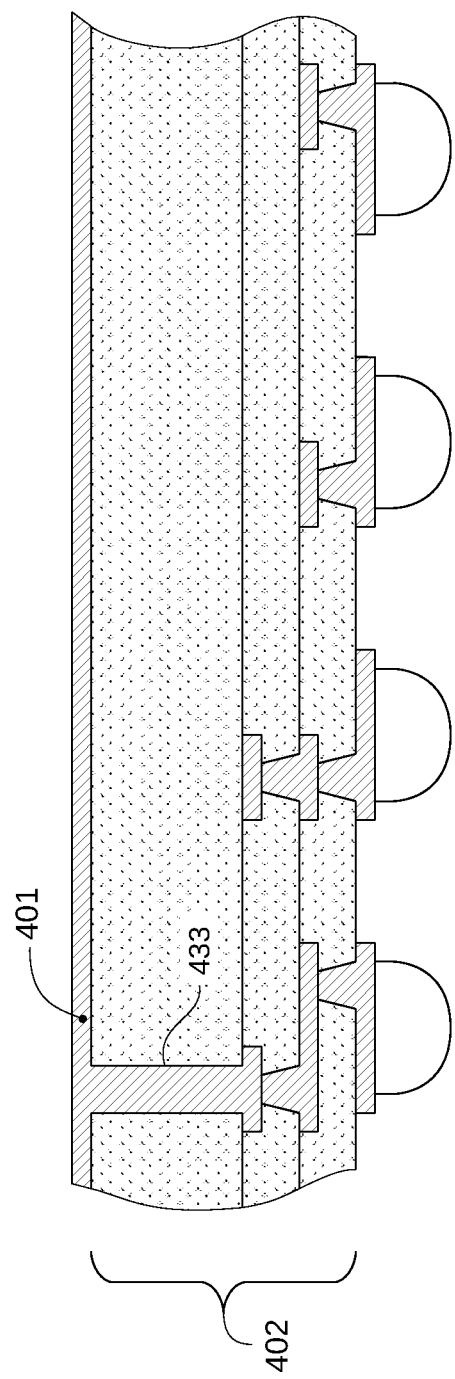
FIGS. 4A-4C sequentially illustrate the results of the different method steps of FIG. 3, according to various embodiments of the present invention.
Figure 4B:
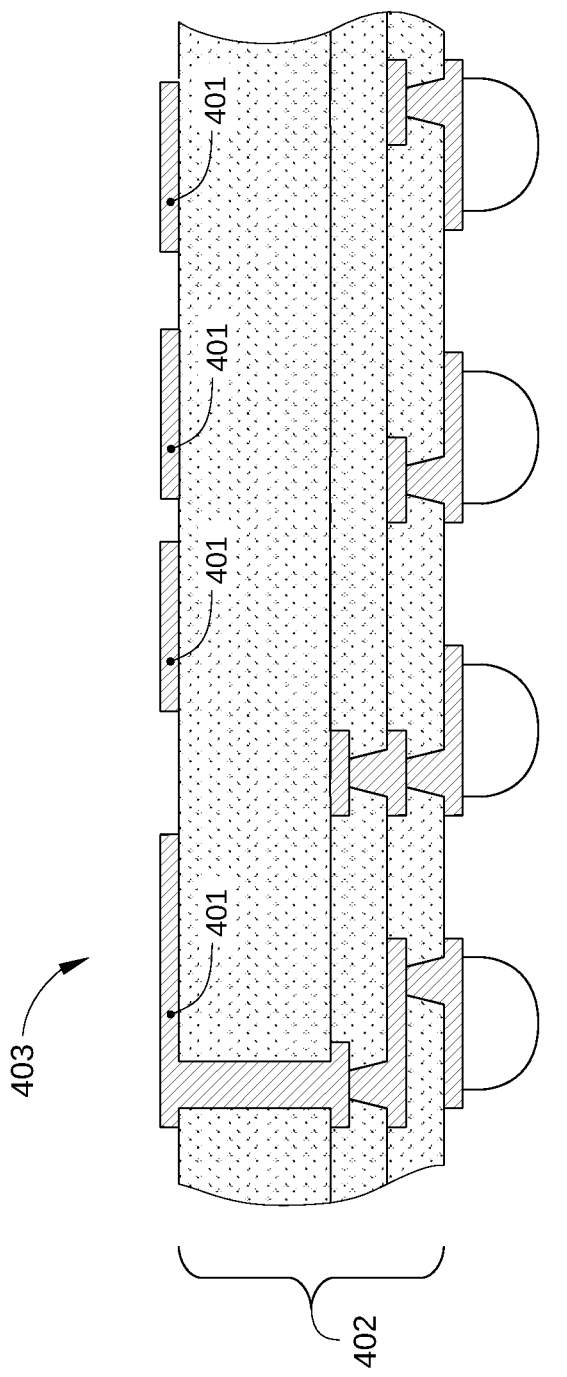
Figure 4C:
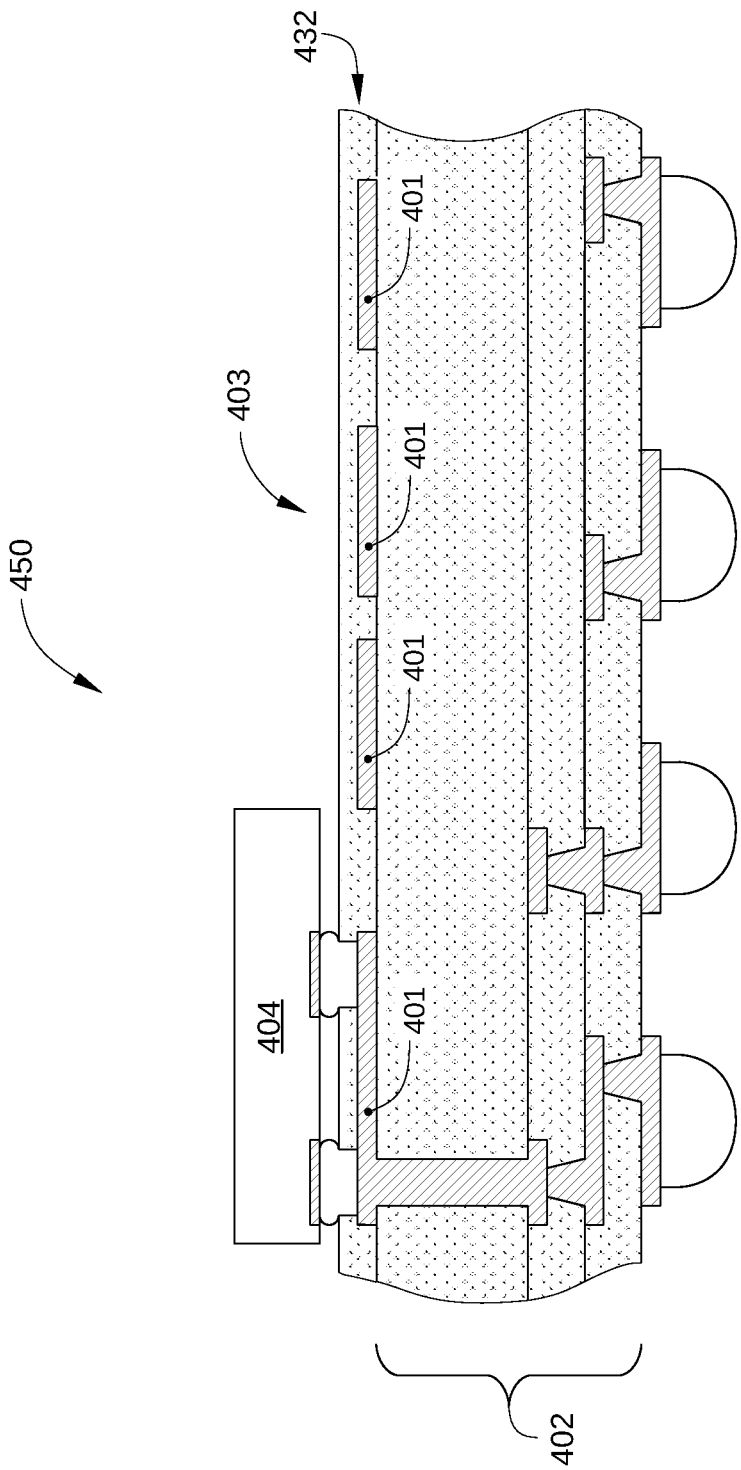

FIG. 3 sets forth a flowchart of method steps for forming an IC chip package that includes a packaging substrate with an electrically conductive grid formed on a dielectric layer, according to one embodiment of the present invention. Although the method steps are described with respect to IC package 100 of FIG. 1, persons skilled in the art will understand that performing the method steps, in any order, to form an IC chip package is within the scope of the present invention. FIGS. 4A-4C sequentially illustrate the results of the different steps 301-303 of FIG. 3.

As shown in FIG. 3, a method 300 begins at step 301, where a layer of electrically conductive material 401 is deposited on a dielectric substrate 402, as shown in FIG. 4A. The dielectric substrate may be a core board of a packaging substrate, such as core board 131 in FIG. 1, or a build-up layer of a packaging substrate, such as one of build-up layers 132 in FIG. 1. In the embodiment illustrated in FIG. 4A, the dielectric substrate is a core board of a packaging substrate, and the layer of electrically conductive material 401 is electrically coupled to a via structure 433 that penetrates the core board. Thus, in FIG. 4A, electrically conductive material 401 may be configured to form a ground plane. In other embodiments, conductive material 401 may be configured to form a power plane or any other substantially planar, electrically conductive structure in a packaging substrate. Electrically conductive material 401 may be deposited via an electroplating process, by bonding a metallic foil onto dielectric substrate 402, or by any other technically feasible approach.

In step 302, a plurality of non-contiguous portions of electrically conductive material 401 is removed from dielectric substrate 402, as shown in FIG. 4B. The removal of these non-contiguous portions of electrically conductive material 401 forms an electrically conductive grid 403 on dielectric substrate 402. Electrically conductive grid 403 may have any of the configurations described above with respect to ground plane 135 in FIG. 2. Any technically feasible patterning and etching approach may be used to selectively remove the plurality of non-contiguous portions of electrically conductive material 401 in step 302.

In step 303, one or more integrated circuit dies 404 are electrically coupled to electrically conductive grid 403 in multiple locations to form an IC package 450, as shown in FIG. 4C. In the embodiment illustrated in FIG. 4C, a single build-up layer 432 is formed on dielectric substrate 402, and integrated circuit die 404 is electrically coupled to electrically conductive grid 403 with solder microbumps or any other technically feasible electrical connection. For simplicity, additional build-up layers, an RDL, a power plane, and a second ground plane are omitted from FIG. 4C. However, in some embodiments, IC package 450 may include multiple build-up layers 432, ground planes, power planes, RDLs, and the like. In embodiments in which electrically conductive grid 403 is configured as a ground plane in a packaging substrate for integrated circuit die 404, electrically conductive grid 403 may be coupled to integrated circuit die 404 at a plurality of ground connections. In embodiments in which electrically conductive grid 403 is configured as a power plane in a packaging substrate for integrated circuit die 404, electrically conductive grid 403 may be coupled to integrated circuit die 404 at a plurality of power connections. Integrated circuit die 404 may be substantially similar to IC chip 101 in FIG. 1, or may be any other IC chip suitable for inclusion in IC package 450.

Figure 5:
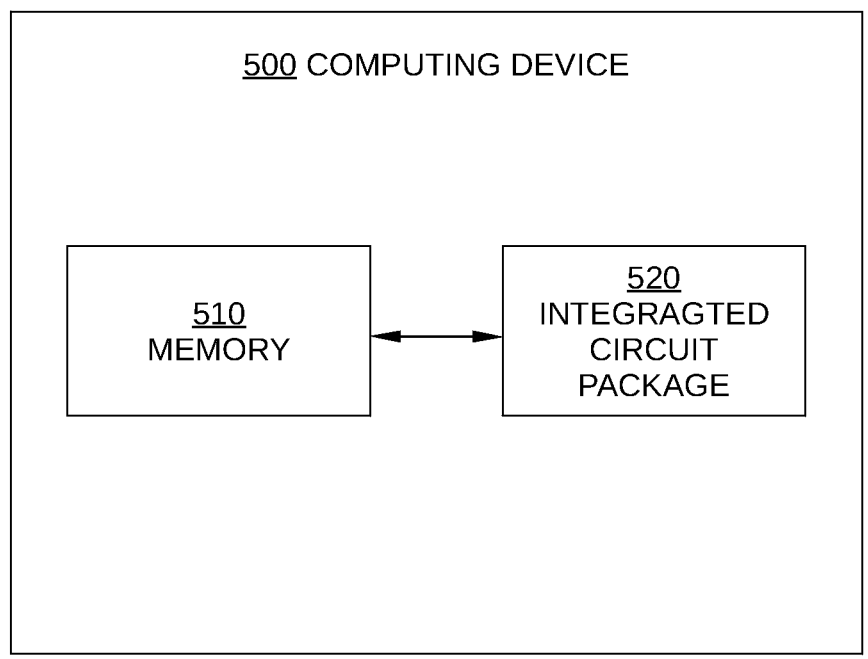
FIG. 5 illustrates a computing device in which one or more embodiments of the present invention can be implemented.

FIG. 5 illustrates a computing device 500 in which one or more embodiments of the present invention can be implemented. As shown, computer system 500 includes a memory 510 and a IC package 520 that is coupled to memory 510 and may be configured according to one or more of the embodiments of the present invention. Computer system 500 may be a desktop computer, a laptop computer, a smartphone, a digital tablet, a personal digital assistant, or other technically feasible computing device. Memory 510 may include volatile, non-volatile, and/or removable memory elements, such as random access memory (RAM), read-only memory (ROM), a magnetic or optical hard disk drive, a flash memory drive, and the like. IC package 520 may be substantially similar in configuration and operation to IC package 100 described above in conjunction with FIGS. 1 and 2, and may comprise a CPU, a GPU, an application processor or other logic device, or any other IC chip-containing device.

In sum, embodiments of the present invention set forth an integrated circuit package with a packaging substrate that has an electrically conductive grid formed on a dielectric layer. The electrically conductive grid may be configured as a ground plane or a power plane of the packaging substrate, and advantageously results in less thermally induced stress in the packaging substrate, since less high-modulus, electrically conductive material is present in the packaging substrate. With less thermally induced stress, the packaging substrate can be advantageously formed with thinner dielectric layers, thereby facilitating a thinner integrated circuit package.

While the foregoing is directed to embodiments of the present invention, other and further embodiments of the invention may be devised without departing from the basic scope thereof, and the scope thereof is determined by the claims that follow.

I claim:

1. An integrated circuit package, comprising:
a packaging substrate that includes at least one of a power plane and a ground plane, wherein the at least one of a power plane and a ground plane comprises a first electrically conductive grid formed on a dielectric layer; and
an integrated circuit die electrically coupled to the first electrically conductive grid at one or more locations,
wherein the first electrically conductive grid includes:
a plurality of electrically conductive portions, wherein each portion is electrically coupled to at least one other portion, and
a plurality of void regions that are electrically non-contiguous and substantially free of electrically conductive material, and
wherein the plurality of electrically conductive portions included in the first electrically conductive grid has a combined surface area that is less than half of a total surface area of the plurality of electrically conductive portions and the plurality of void regions.

2. The integrated circuit package of claim 1, wherein the first electrically conductive grid is formed from a layer of electrically conductive material deposited on the packaging substrate.

3. The integrated circuit package of claim 1, further comprising a second electrically conductive grid that is electrically coupled to the integrated circuit die, and wherein the first electrically conductive grid formed on the dielectric layer comprises a ground plane of the integrated circuit package.

4. The integrated circuit package of claim 3, wherein the second electrically conductive grid includes a plurality of electrically conductive portions, and each portion is electrically coupled to at least one other portion, and a plurality of void regions that are electrically non-contiguous and substantially free of electrically conductive material.

5. The integrated circuit package of claim 3, wherein the second electrically conductive grid is configured as a ground plane of the integrated circuit package.

6. The integrated circuit package of claim 5, further comprising a redistribution layer that is disposed between the second electrically conductive grid and the first electrically conductive grid.

7. The integrated circuit package of claim 5, further comprising a third electrically conductive grid configured as a power plane of the integrated circuit package.

8. The integrated circuit package of claim 1, wherein a via structure that is not electrically coupled to the first electrically conductive grid is disposed in one or more void regions included in the plurality of void regions.

9. The integrated circuit package of claim 1, wherein a thickness of one or more of the plurality of electrically conductive portions is less than 10 microns.

10. A computing device, comprising:
a memory; and
an integrated circuit package coupled to the memory, wherein the integrated circuit package comprises:
a packaging substrate that includes at least one of a power plane and a ground plane, wherein the at least one of a power plane and a ground plane comprises a first electrically conductive grid formed on a dielectric layer; and
an integrated circuit die electrically coupled to the electrically conductive grid at one or more locations,
wherein the first electrically conductive grid includes:
a plurality of electrically conductive portions, wherein each portion is electrically coupled to at least one other portion, and
a plurality of void regions that are electrically non-contiguous and substantially free of electrically conductive material, and
wherein the plurality of electrically conductive portions included in the first electrically conductive grid has a combined surface area that is less than half of a total surface area of the plurality of electrically conductive portions and the plurality of void regions.

11. The computing device of claim 10, wherein the first electrically conductive grid is formed from a layer of electrically conductive material deposited on the packaging substrate.

12. The integrated circuit package of claim 10, wherein a via structure that is not electrically coupled to the first electrically conductive grid is disposed in one or more void regions included in the plurality of void regions.

* * * * *